(12) United States Patent
Meyer

(10) Patent No.: US 6,289,069 B1
(45) Date of Patent: *Sep. 11, 2001

(54) DIGITAL FILTER FOR ROTATION CORRECTION LOOP OF A QPSK OR QAM DEMODULATOR

(75) Inventor: Jacques Meyer, Corenc (FR)

(73) Assignee: STMicroelectronics S.A., Gentilly (FR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/270,381

(22) Filed: Mar. 16, 1999

(30) Foreign Application Priority Data

Mar. 19, 1998 (FR) .................................. 98 03627

(51) Int. Cl.[7] ...................................... H03D 3/24
(52) U.S. Cl. .......................... 375/376; 375/327; 327/156
(58) Field of Search .................... 375/376, 327; 327/147, 150, 156, 158, 159, 149

(56) References Cited

U.S. PATENT DOCUMENTS

| | | | |
|---|---|---|---|
| 5,247,543 | 9/1993 | Tsuda et al. | 375/97 |
| 5,471,508 | 11/1995 | Koslov | 375/344 |
| 5,727,027 | 3/1998 | Tsuda | 375/329 |
| 5,832,043 | * 11/1998 | Eory | 375/344 |

OTHER PUBLICATIONS

French Search Report from French Patent Application 98 03627, filed Mar. 19, 1998.

* cited by examiner

Primary Examiner—Chi Pham
Assistant Examiner—Phuong Phu
(74) Attorney, Agent, or Firm—Wolf, Greenfield & Sacks, P.C.; James H. Morris; Theodore E. Galanthay

(57) ABSTRACT

The present invention relates to a digital filter for a phase-locked loop receiving at least one input signal having a predetermined period, including an element of accumulation of frequency values receiving the output of a phase detector; and an element of accumulation of phase values receiving a weighted sum of the output of the phase detector and of the content of the element of accumulation of frequency values. Each of the accumulation elements includes several frequency or phase value storage locations, circuitry being provided for successively making operative the storage locations in the phase-locked loop during a period of the input signal.

23 Claims, 2 Drawing Sheets

DIGITAL FILTER FOR ROTATION CORRECTION LOOP OF A QPSK OR QAM DEMODULATOR

BACKGROUND OF THE INVENTION

1. Field of the Invention

The present invention relates to so-called QPSK (Quadrature Phase-Shift Keying) and QAM (Quadrature Amplitude Modulation) techniques that allow simultaneous transmission of transmit two binary signals over two carriers of the same frequency but in phase quadrature. The present invention more specifically aims at a rotation correction loop filter in a digital demodulator.

2. Discussion of the Related Art

FIG. 1 shows, in the form of a "constellation", the possible values of two binary signals I and Q to be transmitted. The values of signal I are plotted along a horizontal axis I and the values of signal Q are plotted along a vertical axis Q. In QPSK modulation, each of binary signals I and Q takes a positive value or a negative value of the same amplitude, corresponding to the high and low logic levels. In FIG. 1, points represent the four possible combinations of signals I and Q. These points are normally symmetrical with respect to axes I and Q.

FIG. 2 schematically shows a conventional digital QPSK demodulator. The modulated signal first undergoes a rough analog demodulation. The two components obtained are filtered then provided to analog-to-digital converters 10. Thus, converters 10 respectively provide digital signals I0 and Q0 corresponding to roughly demodulated signals I and Q. As indicated by arrows in FIG. 1, the constellation corresponding to signals I0 and Q0 rotates with respect to the nominal constellation at a speed equal to the frequency error of the rough demodulation.

Thus, to obtain signals I and Q, the constellation has to be rotated in the reverse direction at the same speed. Such is the function of a rotation correction circuit 12 assembled in a phase-locked loop. Rotation correction circuit 12 acts according to a correction signal Φ provided by a phase detector 14 which analyzes outputs I and Q of circuit 12. The output of phase detector 14 is first filtered by a digital low-pass filter 16. Phase detector 14 usually provides the difference between signals I and Q, more specifically value Isgn(Q)-Qsgn(I), where sgn(.) is the function "sign of".

Filter 16 generally is a second order filter which includes two amplifiers (multipliers by a constant) 18 and 19 each receiving the output of phase detector 14. An adder 20 receives the output of amplifier 18 and the integral of the output of amplifier 19. The integral is obtained by a digital integrator in the form of a register 22 connected to an adder 24 for accumulating the values provided by amplifier 19.

Signal Φ which controls rotation correction circuit 12 is provided by an integrator in the form of a register 26 connected to an adder 28 for accumulating the values provided by adder 20.

Registers 22 and 26 are rated by a clock CK. Clock CK is set to the symbol frequency, that is, to the bit transmission rate of each of signals I and Q.

With this configuration, for each new bit transmitted over signals I and Q, registers 22 and 26 accumulate a new value. In fact, register 22 accumulates frequency values while register 26 accumulates phase values. In steady state, the content of register 22 does not vary, and indicates the frequency error of the rough demodulation, while the content of register 26 continuously varies and represents the phase correction to be brought to the constellation to bring it back to its nominal position (FIG. 1).

To reduce the noise sensitivity of the demodulator, the cut-off frequency of filter 16 is chosen to be particularly small, which reduces the lock-in range and increases the convergence duration of the phase-locked loop. The uncertainty on the carrier frequency of signals I and Q is generally greater than the lock-in range, whereby successive trials must be performed by initializing register 22 to different values to find a lock-in range adapted to the effective carrier frequency.

Since the lock-in range decreases with the symbol frequency, the number of trials to be performed, that is, the number of frequency values to be loaded into register 22, correlatively increases. Further, for each tried frequency, a minimum number of symbols has to be processed before determining whether the loop locks or not, but the symbol rate obviously decreases with the symbol frequency. As a result, the locking time, that is, the time required to find a lock-in range adapted to the carrier frequency, increases in average with the square of the inverse of the symbol frequency.

Taking as an example the reception of satellite transmitted signals, the carrier frequency varies by ±5 MHz, the symbol frequency may be set between 1 and 45 Mbits/s, and the lock-in range is on the order of 0.1% of the symbol frequency. Although the carrier frequency has an uncertainty of ±5 MHz, there are means for reducing the uncertainty range to some hundred kHz. Despite this, for a minimum symbol frequency of 1 MHz, and thus a lock-in range of approximately 1 kHz, some hundred frequency trials have to be performed, each trial having to be performed for a few thousands of symbols. As a result, the locking times may reach one second.

SUMMARY OF THE INVENTION

An object of the present invention is to provide a rotation correction loop filter enabling a considerable reduction of the locking time of a digital QPSK or QAM demodulator.

This and other objects are achieved by a digital filter for a phase-locked loop receiving at least one input signal having a predetermined period, including a frequency value accumulation element receiving the output of a phase detector; and a phase value accumulation element receiving a weighted sum of the output of the phase detector and of the content of the frequency value accumulation element. Each of the accumulation elements includes several frequency or phase value storage locations, means being provided for successively making operative the storage locations in the phase-locked loop during one period of the input signal.

According to an embodiment of the present invention, the locations of the frequency value storage element are accessible to be set to different values.

According to an embodiment of the present invention, the filter includes a programmable counter rated in the vicinity of the maximum frequency admitted by the filter's manufacturing technology, the content of which selects a corresponding location of each of the accumulation elements to make it operative in the phase-locked loop.

According to an embodiment of the present invention, the phase-locked loop is a rotation correction loop for a demodulator of a pair of binary signals modulated in phase quadrature, the predetermined period being the transmission duration of a bit by the binary signals.

The foregoing objects, features and advantages of the present invention will be discussed in detail in the following non-limiting description of specific embodiments in connection with the accompanying drawings.

DETAILED DESCRIPTION

A solution which could be envisaged to decrease the locking time would be to use several rotation correction circuits in parallel, the frequency value register 22 of each of the correction circuits being set to a different frequency. The locking time would then be decreased by a factor equal to the number of correction circuits operating in parallel. Of course, the occupied surface area would increase proportionally to this number.

The present invention performs, in parallel, several carrier frequency trials while using a single rotation correction circuit. For this purpose, the trials are concurrent and use in turns the correction circuit at a frequency greater than the symbol frequency. More specifically, the trials are performed at a frequency at least equal to the symbol frequency multiplied by the number of concurrent trials. Given that the rotation correction circuit can operate at a fixed frequency at least equal to the highest symbol frequency, the number of concurrent trials that can be performed increases as the symbol frequency decreases, which is precisely the desired aim, since the locking time is the longest at low symbol frequencies.

Figure 1:
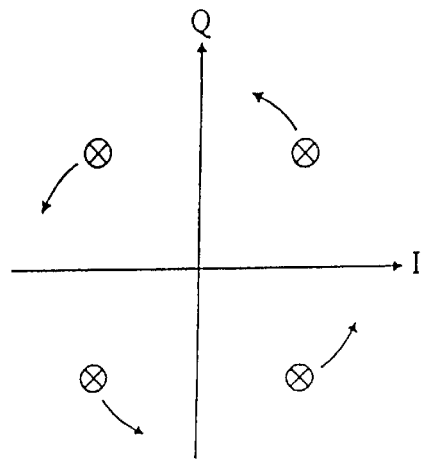
FIG. 1, previously described, shows a constellation of the possible values of a couple of QPSK-modulated signals.
Figure 2:
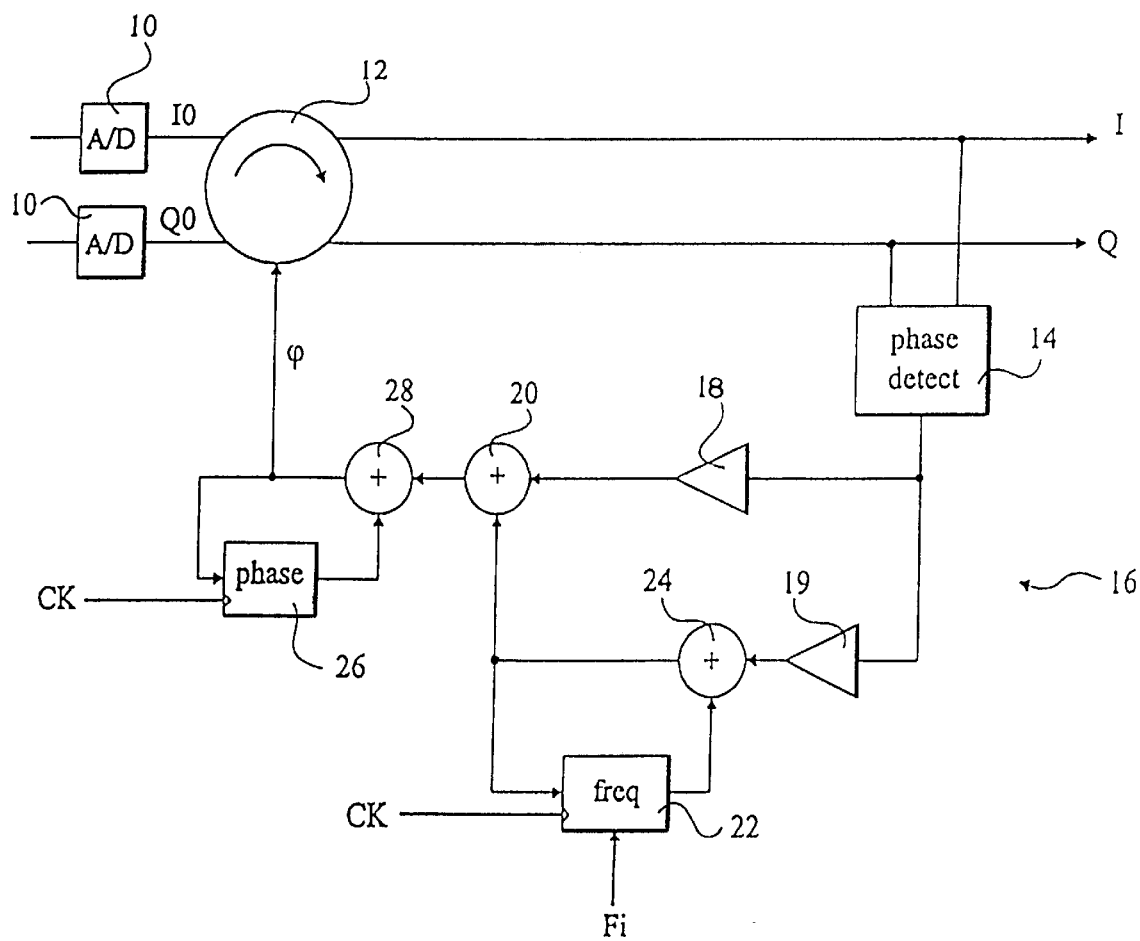
FIG. 2 schematically shows a conventional rotation correction circuit of a QPSK or QAM demodulator.
Figure 3:
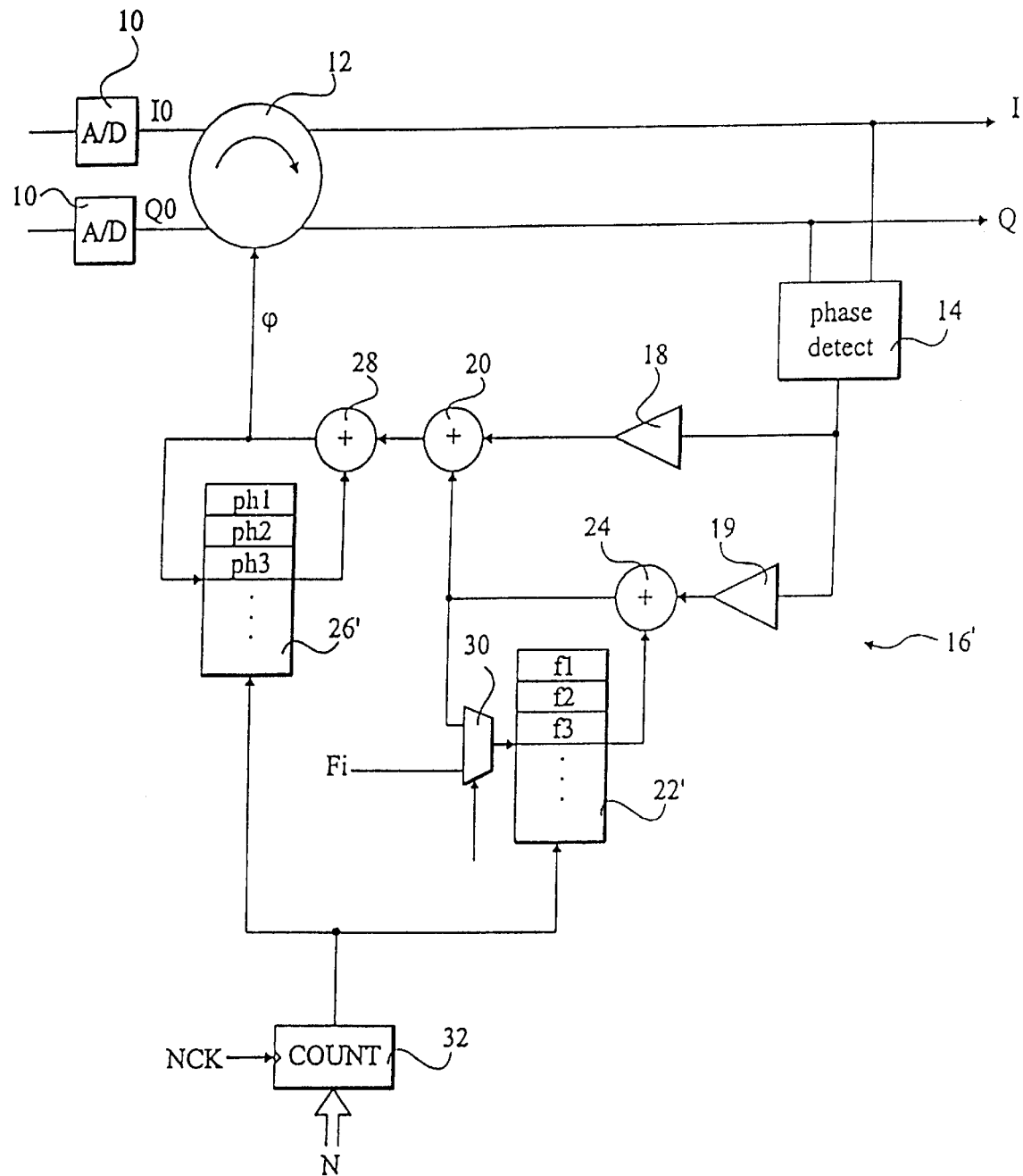
FIG. 3 schematically shows an embodiment of a rotation correction circuit according to the present invention.

FIG. 3 schematically shows an embodiment of a rotation correction circuit according to the present invention enabling this operation. The same elements as in FIG. 2 are designated by the same references. The digital loop filter here is referred to with reference 16'. Frequency value register 22 and phase value register 26 of FIG. 2 have been respectively replaced by a dual port memory 22' and a dual port memory 26'.

Each of these memories contains N locations of frequency or phase values, where N is the number of trials desired to be performed in parallel concurrently. Number N is chosen such that the product of the symbol frequency by N is lower than the maximum frequency allowed by the circuit technology, so that the N memory locations may be accessed in less than one symbol period. Dual port memories 22' and 26' are controlled at the maximum frequency to successively introduce each memory location in the loop so that it performs the function of a register 22 or 26 of FIG. 2, that is, so that it is accessible at the same time in the write mode and in the read mode.

As shown, the read/write addresses of memories 22' and 26' can be provided by a counter 32 which is programmed to count to N. This counter is clocked by a clock NCK of frequency at least N times larger than the symbol frequency (clock CK).

The locations of memory 26' may contain any initial values. However, the locations of memory 22' are set to different frequency values corresponding to the different lock-in ranges which are desired to be tested. For this purpose, the input of memory 22' is preceded by a multiplexer 30 which, during the successive trials, selects the output of adder 24 and which, during a setting phase, selects an input Fi on which setting values are provided in series.

In normal operation, upon occurrence of an active edge of clock signal CK, a new symbol is provided by analog-to-digital converters 10 and counter 32 is reset. Counter 32 selects the first locations of memories 22' and 26'. These locations are then updated according to the value generated by phase detector 14, which does not change for the entire duration of the current symbol.

Before occurrence of the next symbol, counter 32 is successively incremented by clock NCK until value N-1 is reached. At each increment, a new location in memories 22' and 26' is selected and updated according to the value provided by phase detector 14, which does not change for the entire duration of the current symbol.

This procedure is repeated for each received symbol, that is, at each period of clock CK, until the number of symbols necessary to converge has been received.

Then, if the selected location in memory 22' contains a value corresponding to the carrier frequency, a conventional locking detector, not shown, activates a locking indication signal. This locking signal stops counter 32 so that the locations of memories 22' and 26' corresponding to the carrier frequency remain selected.

If the locking signal is not activated, this means that none of the frequency values stored in memory 22' was appropriate. In this case, the locations of memory 22' are reset by a new series of frequency values, to resume the previously-described procedure.

An example of a conventional locking detector includes an accumulator which receives values 1 or −1, according to whether phase detector 14 indicates a good angle or not. When the content of the accumulator exceeds a threshold, a locking is indicated. To use such a locking detector according to the present invention, its accumulator has the same structure as the phase accumulator (26', 28) of FIG. 3, that is, the accumulation register is replaced by a dual port memory controlled by counter 32.

To reset the locations of memory 22', multiplexer 30 is controlled to select input Fi. The new frequency values are then presented in series on input Fi at the rate of clock NCK while counter 32 counts its N cycles.

Of course, this reset phase is not necessary if the number N of locations is sufficient to cover the uncertainty range of the carrier frequency.

In principle, number N varies according to the symbol frequency. Memories 22' and 26' have a fixed number of locations at least equal to the maximum value of N. If the value N used is smaller, the excess locations of memories 22' and 26' are not selected by counter 32.

Dual access memories 22' and 26' may be of simplified structure, since the same location is selected both in the read mode and in the write mode. Further, since these memories receive the same addresses, they can share the same address decoder.

According to an alternative, memories 22' and 26' can be replaced by register columns preceded by a demultiplexer and followed by a multiplexer.

The present invention has been described in relation with a QPSK or QAM demodulator, but it applies to a filter of any phase-locked loop requiring successive frequency trials to find a period characterizing an input signal.

Of course, the present invention is likely to have various alterations, modifications, and improvements which will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A digital filter for a phase-locked loop receiving at least one input signal, the at least one input signal being characterized by a predetermined period, including:
   a frequency value accumulation element receiving an output of a phase detector; and
   a phase value accumulation element receiving a weighted sum of the output of the phase detector and of the content of the frequency value accumulation element;
   wherein each of the accumulation elements includes several registers containing different initial values, which are connected in parallel, in turn to be, to operate as an accumulator during a fraction of one period characterizing the input signal.

2. The digital filter of claim 1, wherein the registers of the frequency value accumulation element are accessible to be set to different values.

3. The digital filter of claim 1, including a programmable counter rated in the vicinity of the maximum frequency admitted by the filter's manufacturing technology, the content of which selects a corresponding register of each of the accumulation elements to connect it to operate as an accumulator.

4. The digital filter of claim 1, wherein the phase-locked loop is a rotation correction loop for a demodulator of a pair of binary signals modulated in phase quadrature, the predetermined period being the transmission duration of a bit by the binary signals.

5. The digital filter of claim 1, wherein the registers of said frequency value accumulation element comprises a frequency memory containing N locations of frequency value.

6. The digital filter of claim 5, wherein the registers of said phase value accumulation element comprises a phase memory containing N locations of phase value.

7. The digital filter of claim 6, further comprising a counter for setting at least said frequency memory to separately stored different frequency values.

8. The digital filter of claim 5, further comprising a counter for setting at least said frequency memory to separately stored different frequency values.

9. The digital filter of claim 1, wherein said phase value accumulation element comprises a phase memory containing N locations of phase value.

10. A digital filter for a phase-locked loop circuit, said digital filter receiving at least one input signal of predetermined period and comprising:
    frequency value accumulation circuit receiving an output of a phase detector of the phase-locked loop circuit;
    said frequency value accumulation circuit comprising frequency memory means containing N locations of frequency value;
    phase value accumulation means receiving a weighted sum of the output of the phase detector and of the content of the frequency value accumulation circuit;
    said phase value accumulation means comprising phase memory means containing N locations of phase value; and
    means for setting at least said frequency memory means to separately stored different frequency values.

11. The digital filter of claim 10, wherein each of said memory means comprise a dual port memory.

12. The digital filter of claim 10, wherein the number N is chosen such that the product of the symbol frequency by N is lower than the maximum frequency allowed by the circuit technology, so that the N memory locations are accessed in less than one symbol.

13. The digital filter of claim 10, wherein said means for setting comprises a counter which is programmed to count to N.

14. The digital filter of claim 13, further comprising a multiplexer and an adder.

15. The digital filter of claim 14, wherein the input of the frequency memory means is preceded by the multiplexer which, during the successive trials, selects the output of adder 24 and which, during a setting phase, selects an input on which setting values are provided in series.

16. A digital filter for a phase-locked loop circuit, said digital filter receiving at least one input signal of predetermined period and comprising:
    frequency value accumulation circuit receiving an output of a phase detector of the phase-locked loop circuit;
    said frequency value accumulation circuit comprising frequency memory containing N locations of frequency value;
    phase value accumulation circuit receiving a weighted sum of the output of the phase detector and of the content of the frequency value accumulation circuit;
    said phase value accumulation circuit comprising phase memory circuit containing N locations of phase value; and
    a counter for setting at least said frequency memory to separately stored different frequency values.

17. The digital filter of claim 16, wherein each of said memory comprises a dual port memory.

18. The digital filter of claim 16, wherein the number N is chosen such that the product of the symbol frequency by N is lower than the maximum frequency allowed by the circuit technology, so that the N memory locations are accessed in less than one symbol.

19. The digital filter of claim 16, wherein said circuit for setting comprises a counter which is programmed to count to N.

20. The digital filter of claim 19, further comprising a multiplexer and an adder.

21. The digital filter of claim 20, wherein the input of the frequency memory is preceded by the multiplexer which, during the successive trials, selects the output of adder 24 and which, during a setting phase, selects an input on which setting values are provided in series.

22. A method of digital filtering for a phase-locked loop circuit in which there is received at least one input signal of predetermined period, said method comprising the steps of:
    providing a frequency value accumulation circuit receiving an output of a phase detector of the phase-locked loop circuit;
    said frequency value accumulation circuit including a frequency memory containing N locations of frequency value;
    providing a phase value accumulation circuit receiving a weighted sum of the output of the phase detector and of the content of the frequency value accumulation circuit;
    said phase value accumulation circuit comprising a phase memory containing N locations of phase value; and
    setting at least said frequency memory to separately stored different frequency values.

23. The method of claim 22, further including the step of alternately receiving at the frequency memory, either an output from the phase detector or, during a setting phase, an input on which setting values are provided in series to the frequency memory.

* * * * *